United States Patent
Chouquet et al.

(10) Patent No.: US 8,367,207 B2
(45) Date of Patent: Feb. 5, 2013

(54) METHOD OF PRODUCING A HYDROGENATED AMORPHOUS CARBON COATING

(75) Inventors: Caroline Chouquet, Gestel (FR); Cédric Ducros, Bevenais (FR); Frédéric Sanchette, Montferrat (FR)

(73) Assignees: Commissariat a l'Energie Atomique et aux Energies Alternative, Paris (FR); Centre National de la Recherche Scientifique, Paris (FR)

( * ) Notice: Subject to any disclaimer, the term of this patent is extended or adjusted under 35 U.S.C. 154(b) by 139 days.

(21) Appl. No.: 12/738,679

(22) PCT Filed: Oct. 20, 2008

(86) PCT No.: PCT/FR2008/001472
§ 371 (c)(1),
(2), (4) Date: Dec. 7, 2010

(87) PCT Pub. No.: WO2009/083673
PCT Pub. Date: Jul. 9, 2009

(65) Prior Publication Data
US 2011/0076476 A1    Mar. 31, 2011

(30) Foreign Application Priority Data
Oct. 23, 2007 (FR) .................................. 07 07422

(51) Int. Cl.
*C23C 16/26* (2006.01)
(52) U.S. Cl. ............. 428/408; 423/446; 427/249.1; 427/249.7; 427/343; 427/402; 427/419.1; 427/419.8; 427/577

(58) Field of Classification Search ............ 427/577, 427/249.1, 249.7, 249.17, 343, 344, 402, 427/419.1, 419.8; 423/446; 428/408, 698
See application file for complete search history.

(56) References Cited

U.S. PATENT DOCUMENTS

| | | | | |
|---|---|---|---|---|
| 5,124,179 A * | 6/1992 | Garg et al. | ............... | 427/249.11 |
| 5,432,003 A * | 7/1995 | Plano et al. | ............... | 428/408 |
| 5,607,723 A * | 3/1997 | Plano et al. | ............... | 427/249.8 |
| 5,803,967 A * | 9/1998 | Plano et al. | ............... | 423/446 |
| 6,582,513 B1 * | 6/2003 | Linares et al. | ............... | 423/446 |

OTHER PUBLICATIONS

Qi J et al., "Mechanical Properties of a-Ch:H Multilayer Films," Diamond and Related Materials, vol. 10, No. 9-10, Sep. 1, 2001, pp. 1833-1838.

Lu et al., "Micromechanical properties of hydrogenated diamond-like carbon multilayers," Surface and Coatings Technology, vol. 201, No. 3-4, Oct. 5, 2006, pp. 1679-1684.

(Continued)

*Primary Examiner* — Archene Turner
(74) *Attorney, Agent, or Firm* — Summa, Additon & Ashe, P.A.

(57) ABSTRACT

The invention relates to a hydrogenated amorphous carbon coating and to a method for the production thereof. It also relates to devices having such a coating. The method of the invention consists in producing a hydrogenated amorphous carbon coating comprising at least two layers of hydrogenated amorphous carbon, each of said layers having chemical compositions and physical and mechanical properties that are identical, and with thicknesses that are identical or different. The coating of the invention finds many applications, in particular in the mechanical field for parts subject to considerable wear and rubbing problems. It may also be applicable, in particular, in the field of surgical implants and in the MEMS (microelectromechanical systems) field.

14 Claims, 2 Drawing Sheets

OTHER PUBLICATIONS

Voevodin A, A. et al., "Architecture of multilayer nanocomposite coatings with super-hard diamond-like carbon layers for wear protection at high contact loads," Wear, vol. 203-204, Mar. 1, 1997, pp. 516-527.

Gupta et al., Tribological behavior of plasma-enhanced CBD a-C:H films, Tribology International 37, 2004, pp. 1031-1038.

Bull, S. J., "Nanoindentation of Coatings," J. Phys. D: Appl. Phys., 38, 2005, R393-R413.

International Search Report of PCT/FR2008/001472 mailed May 15, 2009.

* cited by examiner

METHOD OF PRODUCING A HYDROGENATED AMORPHOUS CARBON COATING

BACKGROUND

The invention relates to a hydrogenated amorphous carbon coating as well as a method for producing same. It also relates to devices comprising such a coating.

Frictional and wear phenomena in mechanical assemblies are the origin of considerable energy losses.

This is why many studies have been carried out over several years on coatings having high mechanical properties in terms of high wear resistance, hardness and toughness.

The coatings that are currently most encountered are coatings made of nitride, such as titanium nitrides (TiN) and chromium nitrides (CrN), carbides such as titanium carbides (TiC), chromium carbides (CrC), tungsten carbides ($W_2C$) and tungsten/carbon carbides (WC/C), oxides such as alumina, deposits based on molybdenum such as molybdenum sulfide ($MoS_2$), as well as all the family of coatings based on carbon called Diamond Like Carbon (DLC).

On account of their exceptional combination of properties, DLCs have revealed themselves to be excellent coatings for parts subject to high friction and wear problems, such as engine parts.

DLC coatings are carbon-based coatings. According to the preparative technique, they possess, in point of fact, not only high hardness but also low coefficients of friction and wear rates.

Some of these coatings are composed of a monolayer, but their main disadvantage is their high level of internal stresses, of the order of a few gigapascals (GPa), which very often limits their thickness to 2 micrometers, which is insufficient in some applications.

This is why research is currently turning toward the use of doped DLCs or of multilayer systems based on DLC.

In point of fact, multilayers based on DLC seem to be able to limit internal stresses and in this way to achieve very much higher coating thicknesses while preserving valuable mechanical properties.

Two main multilayer systems based on hydrogenated amorphous carbon, commonly called a-C:H, appear in the bibliography:

1) stacks of two a-C:H layers that differ from each other, one being said to be hard and the other said to be soft, as described by Gupta et al. in "Tribological behavior of plasma-enhanced CVD a-C:H films", Tribology International 37, (2004), 1031-1038, 2) stacks of the a-C:H/a-SiC:H type.

However, these multilayer stacks, apart from the presence of different materials, have tribological and mechanical (hardness) properties lower than those of a-C:H monolayers.

The object of the invention is to overcome problems of the prior art by providing a multilayer coating based on hydrogenated amorphous carbon having mechanical properties, in terms of hardness, coefficient of friction and wear rate, equivalent to those of a monolayer or multilayer deposit of conventional hydrogenated amorphous carbon, but having lower residual stresses, which makes it possible to increase the total thickness of the coating to 10 micrometers.

To this end, the invention provides a hydrogenated amorphous carbon coating, characterized in that it comprises at least two layers of hydrogenated amorphous carbon having identical chemical compositions and physical and mechanical properties, and identical or different thicknesses.

Preferably, each of said hydrogenated carbon layers has a thickness less than or equal to 500 nm.

Preferably, the coating of the invention has a thickness greater than or equal to 1.5 micrometers, more preferably greater than or equal to 2 micrometers.

In a preferred embodiment, the coating of the invention comprises more than ten layers per micrometer of coating thickness.

The invention also provides a method for depositing the coating of the invention on at least one surface of a substrate comprising steps of depositing, by plasma-enhanced chemical vapor phase deposition, a first layer of hydrogenated amorphous carbon, for a period t1, of stopping the plasma generator for a period t, of depositing a second layer on the previously obtained layer by restarting the plasma generator under the same conditions of power, temperature, pressure and atmosphere as in the deposition step for the first layer, for a period t2 that is identical to or different from the period t1 of the deposition step for the first layer and, optionally, repeating the steps of stopping the generator and of depositing a new layer at last once until the desired coating thickness is obtained.

Preferably, the period t when the generator is stopped is less than the periods of the deposition steps.

Preferably, during the step when the generator is stopped, the upper surface of the layer obtained in the preceding step is scoured.

Preferably, this scouring is performed by ion bombardment of said upper surface in a neutral gas.

In the method of the invention, the periods t1, t2 of the deposition steps are such that the thickness of each layer deposited is less than or equal to 500 nm.

Preferably, in the method of the invention, the steps of stopping the generator and of depositing a new layer are repeated until a final coating thickness is obtained, preferably greater than or equal to 1.5 micrometers, more preferably greater than or equal to 2 micrometers.

Also preferably, the method of the invention additionally includes, before the step of depositing the first layer, a step of depositing an SiC:H layer on the surface of substrate to be coated.

The invention furthermore provides a device comprising a coating according to the invention or obtained by the method according to the invention.

The invention will be better understood and other advantages and features thereof will become more clearly apparent on reading the following description made with reference to the figures in which:

DETAILED DESCRIPTION

The invention consists of depositing on a plastic, metallic or ceramic substrate, a multilayer coating of the hydrogenated amorphous carbon/hydrogenated amorphous carbon type, referred to hereinafter as a-C:H/a-C:H, having mechanical properties, in terms of hardness, coefficient of friction and wear, notably equivalent to those of a conventional a-C:H monolayer, but having lower residual stresses.

The coating according to the invention thus consists of a stack of layers of the same chemical composition having strictly identical mechanical properties and physical characteristics, but interfaces are created between the various layers, which makes it possible to reduce the internal stresses of the coating.

The coating according to the invention is free from cracks that bring about exfoliation of the coating, present in multilayers of the prior art, when it is subjected to residual stresses, while having thicknesses greater than or equal to 1.5 to 2 micrometers.

Moreover, the coating of the invention is composed of layers having all the same physico-chemical properties on account of the strictly identical deposition conditions (with the exception of the deposition period) used for depositing each layer, which enables a deposit of the invention to be obtained having good life expectancy in use.

Moreover, in the prior art, in order to obtain valuable physico-chemical properties, an attempt has been made, as far as the invention is concerned, to make variations in the chemical composition and/or hardness or elasticity of layers making up the multilayer coating, from one layer to another.

The layers constituting the coating of the invention certainly have the same chemical composition and mechanical properties and physical characteristics that are strictly identical, but they may have identical or different thicknesses.

In all cases, all the layers of the multilayer coating according to the invention preferably have thicknesses less than 500 nanometers (nm).

The coating of the invention thus comprises at least two layers, but in order to obtain coating thicknesses greater than or equal to 2 micrometers, the coating of the invention will comprise as many layers as is necessary.

For example, in order to obtain a coating thickness of 2 micrometers, 80 layers of 25 nm will be formed.

Such a thickness guarantees better life expectancy for the coated part.

Thus, the coating of the invention may be obtained by stacking as many layers of a-C:H that are identical, possibly apart from their thickness, as are necessary for achieving coating thicknesses up to 10 micrometers inclusively, while preserving equivalent, if not superior, mechanical properties, to those of a monolayer coating of the prior art.

Figure 1:
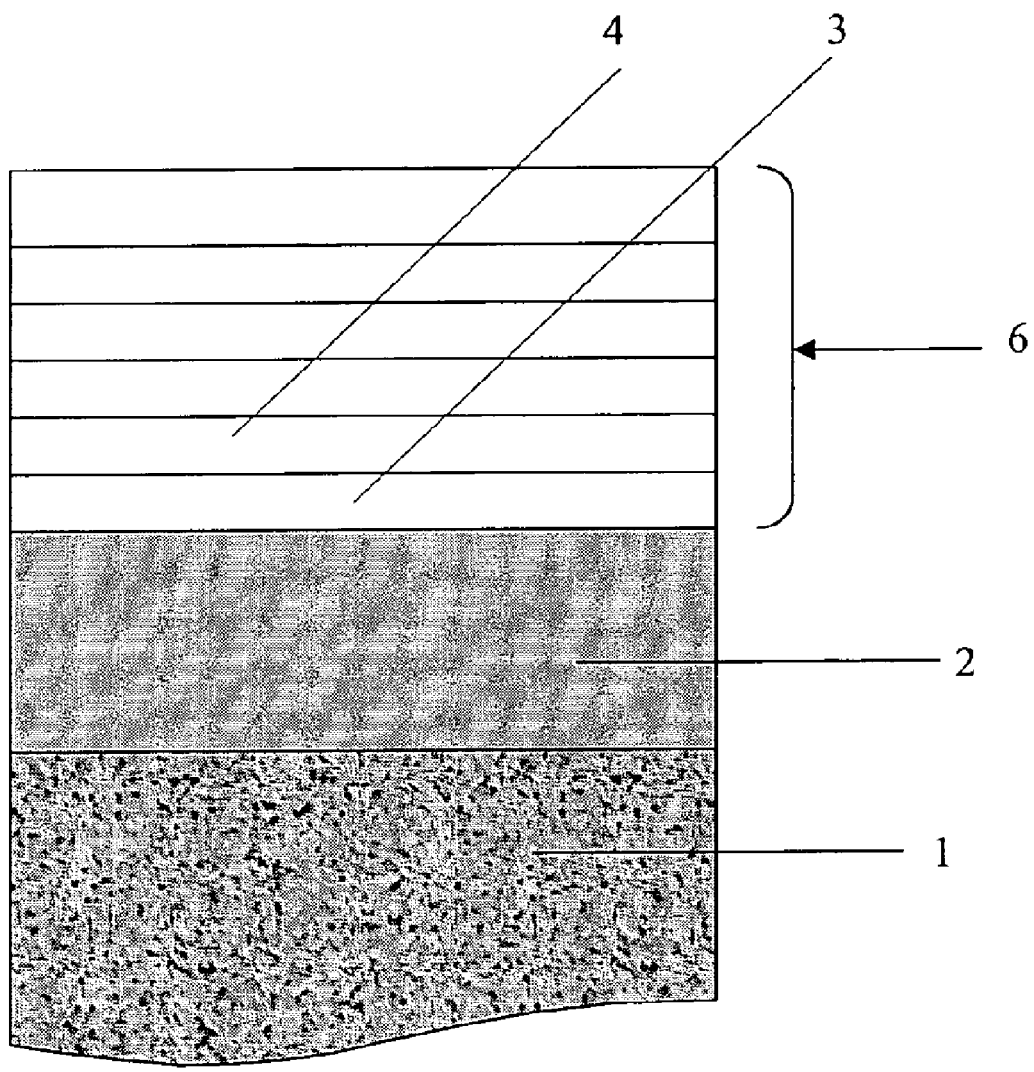
FIG. 1 shows a schematic section of an embodiment of the coating according to the invention deposited on at least one surface of a substrate.

The architecture of a first embodiment of the coating of the invention is presented schematically in FIG. 1.

As will be seen in FIG. 1, the multilayer coating according to the invention, reference 6 in FIG. 1, consists of a stack of layers that are identical, including their thickness, reference 3, 4 and 5 of FIG. 1.

These layers are deposited on a substrate, reference 1 in FIG. 1.

However, other architectures for the coating of the invention exist.

These architectures are architectures in which the stacked layers forming the coating of the invention do not all have the same thickness.

For example, in order to improve still further the tribological and mechanical qualities of the coating, it is advantageous to deposit thin layers first of all and then thicker layers.

Thus, in a second preferred embodiment of the invention, for a coating having a final thickness of 10 microns, the layers forming the first five microns deposited on the substrate are layers with a thickness of 10 nm and layers forming the last five microns of the total thickness of the coating, are layers having a thickness of 100 nm.

However, the coating of the invention may also consist of a stack of layers that have thicknesses increasing progressively, according to a linear or other progression, from 10 nm to 500 nm.

The multilayer coating of the invention represented in FIG. 1 is not deposited directly on the substrate.

It may in point of fact be necessary, according to the type of substrate, to provide, between the substrate 1 and the coating 6 according to the invention, an intermediate layer, reference 2 in FIG. 1, made of SiC:H with a thickness between 200 and 800 nm inclusively, preferably of approximately 400 nm, in order to improve the adhesion of the coating 6 to the substrate 1.

The method of the invention for producing the coating of the invention consists of depositing on a metallic, plastic or ceramic support a stack of layers of a-C:H that are strictly identical, although their thicknesses may differ, by plasma-enhanced chemical vapor deposition commonly called PECVD.

Figure 2:
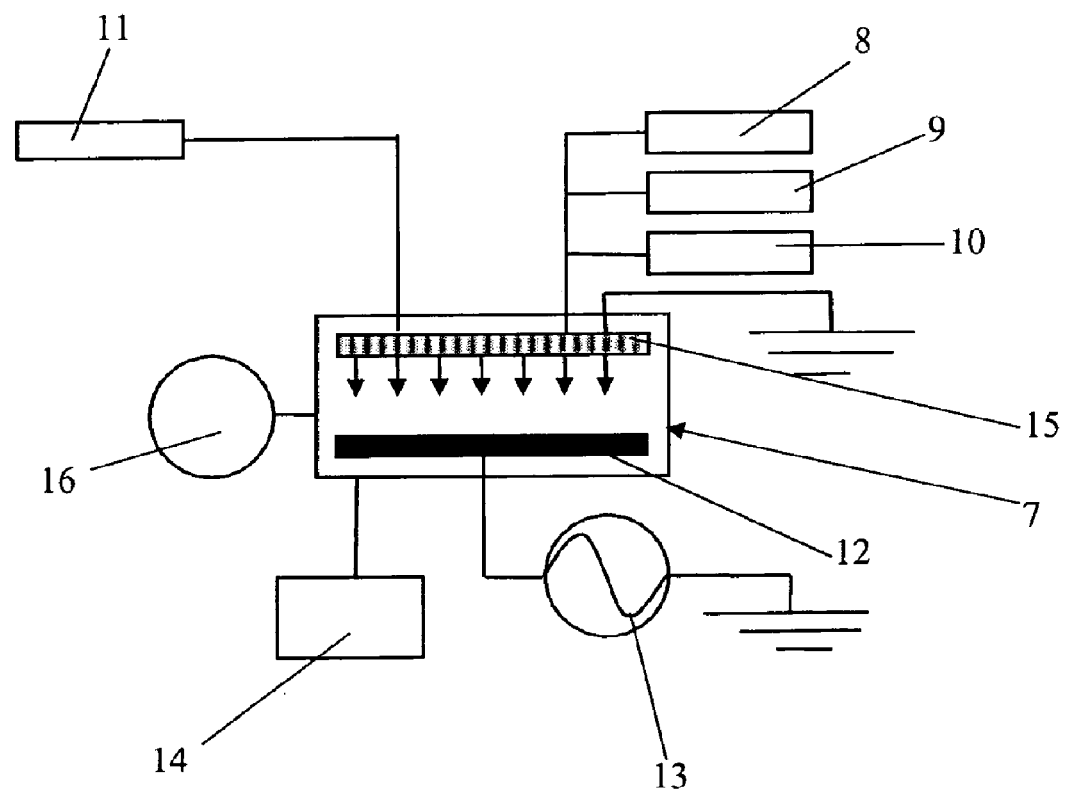
FIG. 2 shows schematically a chamber for plasma enhanced chemical vapor deposition.

A PECVD chamber is represented schematically in FIG. 2.

As will be seen in FIG. 2, the PECVD chamber, reference 7 in FIG. 2, is supplied with nitrogen through the pipeline reference 8 in FIG. 2, with hydrogen through the pipeline reference 9 in FIG. 2 and with argon through the pipeline reference 10 in FIG. 2. As regards the hydrogenated amorphous carbon precursor, this is introduced into the chamber 7 through the supply pipeline reference 11 in FIG. 2.

The chamber 7 is kept under vacuum by the vacuum pump reference 14 in FIG. 2. The pressure in the chamber 7 is controlled by the gauge, reference 16 in FIG. 2. The chamber is supplied by the power generator, reference 13 in FIG. 2. A sample carrier, reference 12 in FIG. 2, on which the substrate 1 to be coated is placed, is located inside the chamber 7. A layer, reference 15 in FIG. 2, makes it possible to vaporize the carbonaceous precursor and argon, hydrogen and argon gases on the sample, not shown in FIG. 2.

The sample is placed directly on the sample carrier 12 corresponding to the polarized electrode. The inter-electrode distance between the sprinkler 15 and the sample carrier 12 is kept constant at 200 mm.

Then, a gaseous mixture is introduced that is a precursor for the hydrogenated amorphous carbon consisting of 80% by volume based on the total volume of the mixture of $C_6H_{12}$ and 20% $H_2$.

The pressure in the chamber is maintained between 2 and 10 pascal (Pa). It is preferably maintained at 4 Pa.

The power applied to the electrode (sample carrier 12) is 320 watts (W) with a voltage of 670 volts (V). This voltage is equivalent to a polarization voltage.

The coating 1 of the invention is obtained while creating interfaces during the production of a standard a-C:H coating. The deposition parameters are thus strictly identical for all the layers deposited and are the same as for the preparation of a standard hydrogenated amorphous carbon coating, with the exception of the duration of each deposition step that may vary according to the desired thickness of each layer.

The time intervals are advantageously less than the deposition period for the last layer prepared.

This means that when the last layer produced is the layer formed in step a), the period during which the generator is stopped will be less than the duration of this step a), and when the latter layer produced is one formed in step c) or when step c) is repeated, the period during which the generator is stopped will be less than the duration of this latter step c) or of the repeat of step c).

As regards the deposition period between two stops of the generator, this is adapted according to the desired thickness in order to obtain the elementary layer considered. This thickness lies between 10 nm and 500 nm inclusively.

In the case of a coating with layers of identical thickness, when the generator is once again ignited, it is left ignited for the same period as for the deposition of the first layer and it is once again stopped for the same duration as when the first layer is deposited. This manipulation of igniting the generator and stopping the generator is repeated as many times as necessary for obtaining the coating of the desired thickness.

In the case of a coating with layers of variable thickness, the deposition and stopping time will be adapted according to the desired thicknesses.

The period during which the generator is extinguished corresponds to the creation of a transition phase between two layers of a-C:H. It is important to multiply the number of interfaces in order to minimize stresses. Advantageously, 10 layers per micrometer of coating are necessary. This cut-off period should be maintained sufficiently low so as not to create a surface contamination phenomenon.

A scouring step, for example by ion bombardment in a neutral gas, may optionally be carried out during each deposition in order to improve the quality of the interfaces.

In this way, the creation of interfaces within a hydrogenated DLC deposit makes it possible to reduce the residual stresses of the coating 1. The production of a coating having greater thicknesses than those than can be attained, without the appearance of residual stresses, with coatings of the prior art whether they be monolayers or multilayers, is thus possible while retaining valuable mechanical and tribological properties (hardness, Young's modulus, coefficient of friction and rate of wear substantially identical to a multilayer coating). In this way, the possibility of maintaining a wear rate and a coefficient of friction as low as that with a standard DLC with a thickness multiplied by 5, makes it possible to increase considerably the life of parts treated in this way.

In order better to understand the invention, an example of an embodiment will now be described in a purely illustrative and non-limiting way.

EXAMPLE 1

The part to be coated was a steel part with a mirror polish and a diameter of 50 millimeters (mm).

The part was first of all scoured, that is to say chemically cleaned with acetone using an ultrasound bath, and dried with alcohol before being placed on the sample carrier 12 in the PECVD chamber 7.

The chamber 7 was put under secondary vacuum (at approximately 2×10-6 millibar (mbar)) and ion scouring was carried out by injecting a gas mixture consisting of argon and hydrogen.

In this scouring step, the argon flow rate was 90 sccm, the hydrogen flow rate was 90 standard cubic centimeters per minute (sccm), and the pressure in the chamber 7 was 5 Pa. The power applied to the polarization electrode (sample carrier 12) was 300 W and the voltage 300 V.

This scouring step lasted 20 minutes.

A layer 2 of SiC:H was then deposited with a thickness of 400 nm on the substrate 1.

This layer 2 was deposited so as to obtain and optimize adhesion of the coating of the invention to the sample.

Tetramethylsilane was then introduced at a flow rate of 125 sccm under a pressure of 10 Pa while applying power of 100 W and a voltage of 410 V on the polarization electrode (sample carrier 12).

The multilayer coating of the invention was then deposited. The parameters used for depositing each layer making up this coating were:

$C_6H_{12}$ flow rate: 100 sccm,
$H_2$ flow rate: 25 sccm,
pressure: 4 Pa,
power: 320 W,
voltage: 670 V.

Each deposition step lasted 28 seconds so as to obtain a 25 nm thick layer.

The generator was extinguished every 28 seconds for exactly 2 seconds in order to create the interface.

80 layers were deposited in this way.

The mechanical properties of the coating obtained in this way were studied and the comparison with those of a conventional a-C:H deposit are given in table 1 below:

TABLE 1

| | Hardness (GPa) | Young's modulus (GPa) | Residual stresses (MPa) | Coefficient of friction | Wear rate $(mm^3N^{-1}m^{-1})$ |
| --- | --- | --- | --- | --- | --- |
| Conventional a-C:H monolayer deposit (~2 μm) | 19 ± 2 | 142 ± 10 | 1100 ± 100 | 0.04 ± 0.02 | $1.7 \times 10^{-7}$ |
| Coating of the invention a-C:H/a-C:H (~2 μm) | 20 ± 2 | 159 ± 10 | 750 ± 100 | 0.05 ± 0.02 | $2.1 \times 10^{-7}$ |

The residual stresses were obtained from the Stoney formula on 0.1 mm thick stainless steel foils.

The values of the coefficient of friction and the rate of wear indicated in table 1 corresponded to those obtained on a pin-on-disk test carried out at ambient temperature and humidity with an alumina ball and a Hertz pressure of approximately 650 MPa for 100,000 cycles at 0.17 m/s.

These values were obtained by the methods described in S. J. Bull, Nanoindentation of coatings, J. Phys. D: Appl. Phys., (2005) R393-R413.

There are many industrial applications for this type of coating. Mention may be made of all engine parts that are subject to considerable frictional and wear problems. Moreover, on account of the diverse properties of hydrogenated DLCs, namely their great chemical inertia, their special electrical properties as well as their haemo- and bio-compatibility, these deposits may also be applied to the fields of surgical implants as well as electromechanical microsytems (MEMS).

The invention claimed is:

1. A coating of hydrogenated amorphous carbon comprising at least two superposed layers of hydrogenated amorphous carbon, each of said layers having identical chemical compositions and physical and mechanical properties, and identical or different thicknesses, said coating having a thickness greater than or equal to 1.5 micrometers.

2. The coating as claimed in claim 1, characterized in that each of said layers of hydrogenated amorphous carbon has a thickness less than or equal to 500 nm.

3. The coating as claimed in claim 1 characterized in that it has a thickness greater than or equal to 2 micrometers.

4. A device comprising a coating as claimed in claim 1.

5. The coating as claimed in claim 1 characterized in that it comprises more than ten layers per micrometer of coating thickness.

6. A method for depositing a coating on at least one surface of a substrate comprising the following steps:
   a) depositing by plasma-enhanced chemical vapor phase deposition, a first layer of hydrogenated amorphous carbon, for a period $t_1$,
   b) stopping the plasma generator for a period t, and
   c) depositing a second layer (4) on the layer (3) obtained in step a) by restarting the plasma generator under the same conditions of power, temperature, pressure and atmosphere as in step a), for a period $t_2$ that is identical to or different from the period $t_1$ of step a),
   said steps b) and c) being repeated until a final thickness of the coating is obtained greater than or equal to 1.5 μm.

7. The method as claimed in claim 6, characterized in that the period t during which the plasma generator is stopped in step b) is less than the duration of each of the deposition steps a) or c).

8. The method as claimed in claim 6, characterized in that, during the step b) when the generator is stopped, the upper surface of the layer obtained in the preceding step is scoured.

9. The method as claimed in claim 8, characterized in that said scouring is performed by ion bombardment of said upper surface in a neutral gas.

10. The method as claimed in claim 6, characterized in that the periods $t_1$ and $t_2$ of steps a) and c) are such that the thickness of each of said layers is less than or equal to 500 nm.

11. The method as claimed in claim 6, characterized in that it additionally includes, before step a), a step of depositing a layer of SiC:H on said at least one surface of the substrate.

12. A device comprising a coating obtained by the method of claim 6.

13. A method according to claim 6 comprising repeating steps b) and c) at least once until the desired coating thickness is obtained.

14. The method as claimed in claim 6 characterized in that the steps b) and c) are repeated until a final thickness of the coating is obtained greater than or equal to 2 micrometers.

\* \* \* \* \*